(12) United States Patent
Kuan

(10) Patent No.: US 8,513,540 B2
(45) Date of Patent: Aug. 20, 2013

(54) SHIELDING ASSEMBLY

(75) Inventor: Chang-Ming Kuan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 223 days.

(21) Appl. No.: 13/164,763

(22) Filed: Jun. 20, 2011

(65) Prior Publication Data
US 2012/0217051 A1    Aug. 30, 2012

(30) Foreign Application Priority Data
Feb. 24, 2011   (CN) ...................... 2011 2 0046950 U

(51) Int. Cl.
*H05K 9/00* (2006.01)

(52) U.S. Cl.
USPC ........... 174/350; 174/372; 174/373; 174/382; 174/384; 361/816; 361/818

(58) Field of Classification Search
CPC ....................................................... H05K 9/00
USPC ........ 174/350, 372, 373, 382, 384; 361/816, 361/818
See application file for complete search history.

*Primary Examiner* — Timothy Thompson
*Assistant Examiner* — Charles Pizzuto
(74) *Attorney, Agent, or Firm* — Altis Law Group, Inc.

(57) ABSTRACT

A shielding assembly comprises a pair of covers. Each cover comprises a body, an overlapping portion, and a plurality of sidewalls. The body comprises a first engaging portion, a second engaging portion and a slot defined at one end of the second engaging portion neighboring to the first engaging portion. The overlapping portion comprises a joint portion extending from the first engaging portion, a extending portion extending from the joint portion and parallel to the body, and a latching portion shaped on one end of the extending portion neighboring to the second engaging portion. The extending portion of one of the covers overlaps the second engaging portion of another one of the covers, and the latching portion of one of the covers is latched in the slot in another one of the covers.

5 Claims, 3 Drawing Sheets

SHIELDING ASSEMBLY

BACKGROUND

1. Technical Field

The disclosure generally relates to shielding assemblies.

2. Description of Related Art

In order to protect electronic components on a circuit board of an electronic device from electromagnetic interference (EMI), shielding assemblies are generally employed to cover the electronic components. A commonly used shielding assembly is made by punching a metal piece and soldering the punched metal piece to the circuit board. With this structure, to repair the electronic components, the shield must be disassembled from the circuit board with special tools, which is inconvenient and may become damaged and deformed and becomes unusable in the disassembly process the shield.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
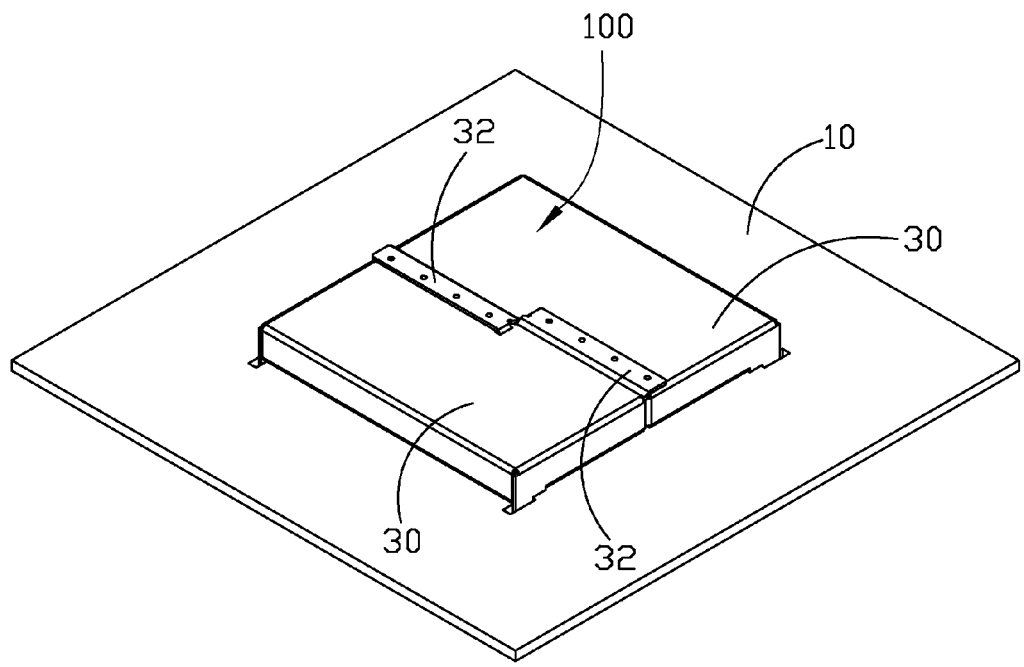
FIG. 1 is a perspective, isometric view of a shielding assembly in accordance with an exemplary embodiment of the disclosure, in which the shielding assembly is mounted to a circuit board.
Figure 2:
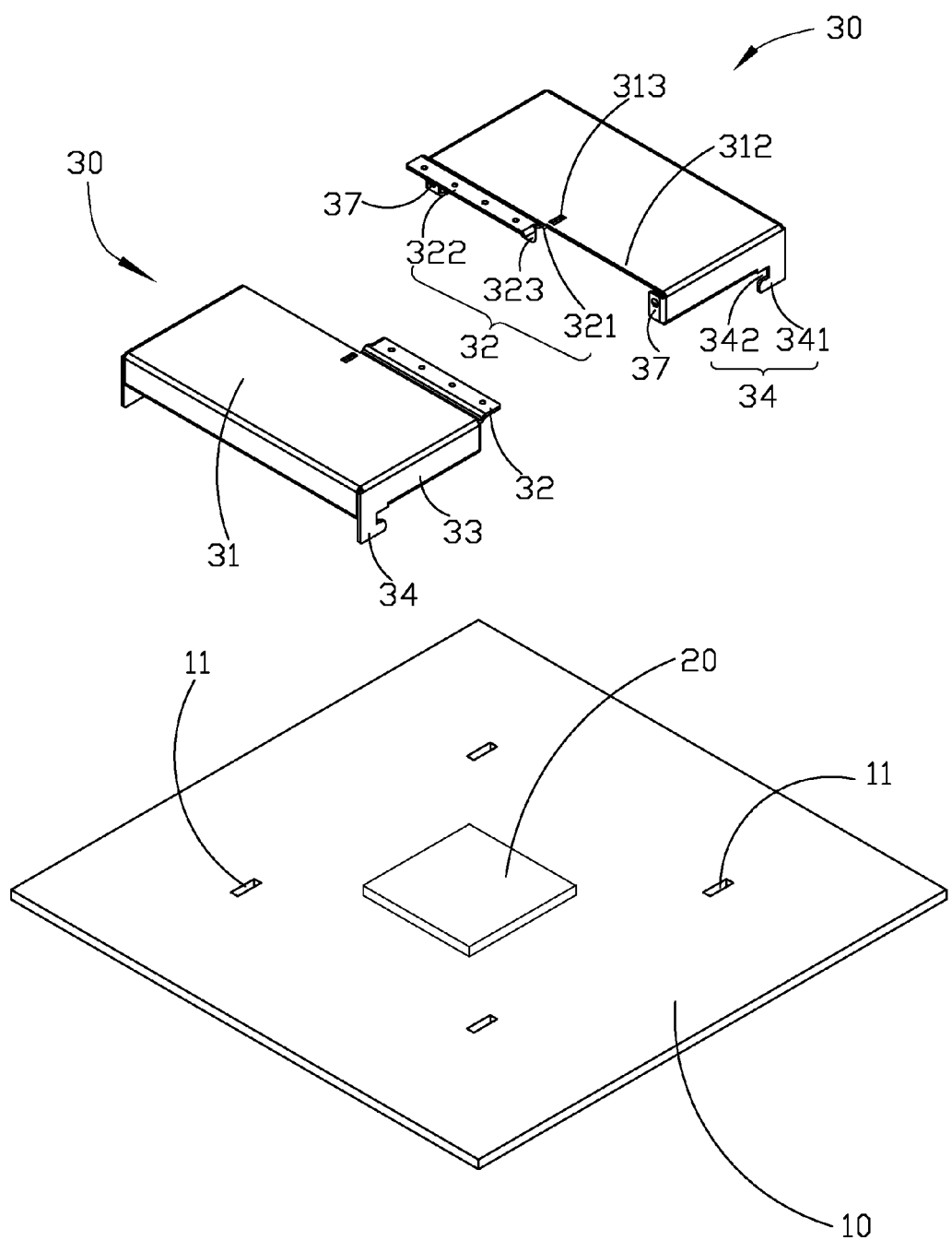
FIG. 2 is a disassembled perspective view of FIG. 1.

FIG. 1 is a perspective, isometric view of a shielding assembly 100 in accordance with an exemplary embodiment of the disclosure, in which the shielding assembly 100 is mounted to a circuit board 10. FIG. 2 is a disassembled perspective view of the shielding assembly 100 of FIG. 1. The shielding assembly 100 protects an electronic component 20 positioned on the circuit board 10 from electromagnetic interference (EMI).

Figure 3:
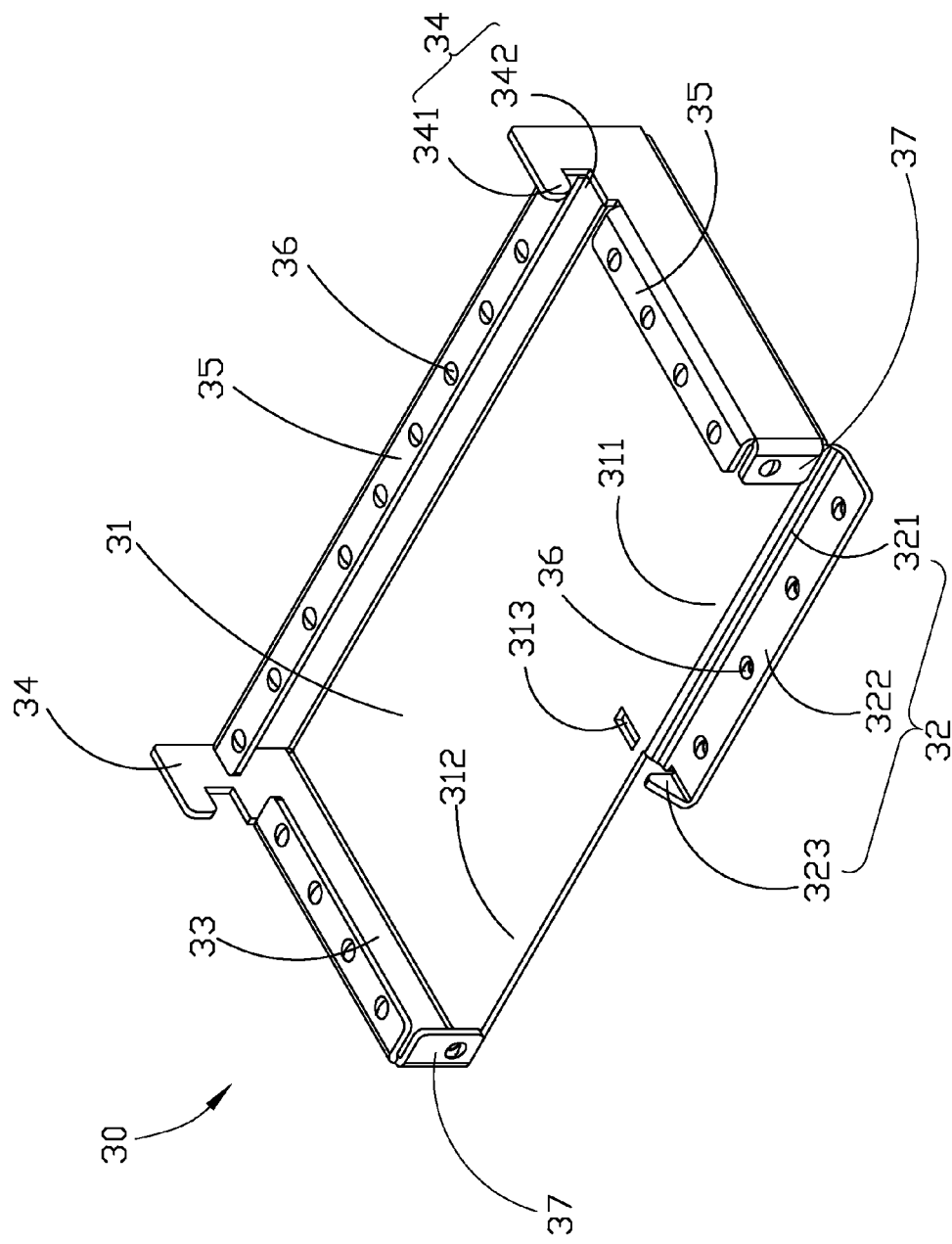
FIG. 3 is an inverted view of a cover of the shielding assembly of FIG. 1.

With references to FIGS. 1-3, the shielding assembly 100 comprises a pair of covers 30, each of the covers 30 comprises a body 31, an overlapping portion 32, a plurality of sidewalls 33, and a pair of opposite pins 34. The body 31 comprises a first engaging portion 311, a second engaging portion 312 and a slot 313 defined at one end of the second engaging portion 312 neighboring to the first engaging portion 311. A length of the first engaging portion 311 of one of the pair of the covers 30 is equal to that of the second engaging portion 312 of another of the pair of the covers 30.

The overlapping portion 32 comprises a joint portion 321 extending from the first engaging portion 311, an extending portion 322 extending from the joint portion 321 and parallel to the body 31, and a latching portion 323 shaped on one end of the extending portion 322 neighboring to the second engaging portion 312. The joint portion 321 makes the extending portion 322 stagger from the first engaging portion 311. With the staggered structure, when the pair of the covers 30 are assembled together, the first engaging portion 311 of one of the pair of the covers 30 inosculates the second engaging portion 312 of another one of the pair of the covers 30, and the extending portion 322 of one of the pair of the covers 30 overlaps the second engaging portion 312 of another one of the pair of the covers 30. In the embodiment, the latching portion 323 is a hook.

The plurality of sidewalls 33 extend downwardly from the body 31 to connect the circuit board 10. The first and second engaging portions 311, 312 are configured on one edge of the body 31, and the plurality of sidewalls 33 are configured on other edges of the body 31. The pair of pins 34 extend respectively from two opposite sidewalls 33. Each of the pins 34 comprises a hook 341. In the embodiment, a gap 342 is defined between the hook 341 of each pin 34 and a corresponding sidewall 33. Correspondingly, the circuit board 10 comprises a plurality of fixing holes 11 capable of being matched with the pins 34 of the covers 30. In assembly, the pins 34 of the covers 30 are inserted through the fixing holes 11, and then the covers 30 are attached to the circuit board 10 with the circuit board 10 latched in the gaps 342 by moving the pair of covers 30 toward each other.

In the embodiment, each of the covers 30 further comprises a plurality of bottom walls 35 respectively extending perpendicularly to the plurality of sidewalls 33, and a pair of resisting walls 37 respectively extending perpendicularly from two tail ends of the plurality of sidewalls 33 and toward each other. In the embodiment, one of the resisting walls 37 is perpendicular to one end of the first engaging portion 311 of the body 31, and another one of resisting walls 37 is perpendicular to one end of the second engaging portion 312, as shown in FIG. 3. In assembly, the bottom walls 35 resist on the circuit board 10 and the resisting walls 37 of the covers 30 resists with each other to fix the shielding assembly 100 firmly.

In the embodiment, each of the bottom walls 35 comprises a plurality of projections 36 correspondingly contacted with the circuit board 10, and the extending portion 322 of the overlapping portions 32 of one of the covers 30 comprises a plurality of projections 36 contacted with the second engaging portion 312 of the body 31 of another one of the covers 30. The plurality of projections 36 are configured to ensure contact between the bottom walls 35 and the circuit board 10 and between the extending portion 322 of one of the covers 30 and the second engaging portion 312 of another one of the covers 30, so as to efficiently reduce EMI.

During assembly of the shielding assembly 100, the pair of cover 30 are positioned on the circuit board 10 with the overlapping portion 32 and the second engaging portion 312 of one of the covers 30 respectively opposite to the second engaging portion 312 and the overlapping portion 32 of another one of the cover 30, and the pins 34 of the covers 30 inserted into corresponding fixing holes 11 of the circuit board 10. Subsequently, the covers 30 move toward each other by an external force, which results in the circuit board 10 latching in the gaps 342 of the covers 30, the extending portion 322 of one of the covers 30 overlaps the second engaging portion 312 of another one of the covers 30, and the latching portion 323 of one of the covers 30 is latched in the slot 313 in another one of the covers 30. By this way, the covers 30 are cooperatively engaged to be a sealed cover.

To repair the electronic component 20, the latching portion 323 of one of the covers 30 is released from the slot 313 in another one of the covers 30, and the covers 30 move away from each other under an external force, which leads to the circuit board 10 quitting from the gaps 342 of the covers 30. By this way, the shielding assembly 100 can be taken out from the circuit board 10.

The shielding assembly 100 is configured with two covers 30 having the same structure, so that the shielding assembly 100 can be made by one module, which lead to low cost of manufacturing the shielding assembly 100. Furthermore, the shielding assembly 100 can be opened and closed freely while repairing the electronic component 20, and can be used many times, which leads to convenience and low cost to repair the electronic component 20.

While the exemplary embodiments have been described, it should be understood that it has been presented by way of example only and not by way of limitation. The breadth and scope of the disclosure should not be limited by the described exemplary embodiments, but only in accordance with the following claims and their equivalents.

What is claimed is:

1. A shielding assembly for an electronic component positioned on a circuit board, the shielding assembly comprising a pair of covers engaging with each other, wherein each of the covers comprises:
    a body comprising a first engaging portion, a second engaging portion and a slot defined at one end of the second engaging portion neighboring to the first engaging portion;
    an overlapping portion comprising a joint portion extending from the first engaging portion, an extending portion extending from the joint portion and parallel to the body, and a latching portion shaped on one end of the extending portion neighboring to the second engaging portion; and
    a plurality of sidewalls extending downwardly from the body and connected to the circuit board;
    wherein the first engaging portion of one of the pair of the covers inosculates the second engaging portion of another one of the pair of the covers, the extending portion of one of the covers overlaps the second engaging portion of another one of the covers, and the latching portion of one of the covers is latched in the slot in another one of the covers.

2. The shielding assembly as claimed in claim 1, wherein each of the covers comprises a pair of pins respectively extending from two opposite sidewalls of the cover, the circuit board comprises a plurality of fixing holes capable of being respectively matched with the pins of the covers to attach the pair of covers on the circuit board.

3. The shielding assembly as claimed in claim 2, wherein each of the pins comprises a hook, a gap is defined between the hook of each of the pins and a corresponding sidewall, the covers are attached to the circuit board with the circuit board latched in the gaps by moving the covers toward each other.

4. The shielding assembly as claimed in claim 1, wherein each of the covers comprises a plurality of bottom walls corresponding to the plurality of sidewalls, each of the bottom walls extends perpendicularly from a corresponding sidewall and resists the circuit board.

5. The shielding assembly as claimed in claim 4, wherein each of the bottom walls comprises a plurality of projections correspondingly contacted with the circuit board, and the extending portion of the overlapping portions of one of the covers comprises a plurality of projections contacted with the second engaging portion of the body of another one of the covers.

* * * * *